(12) United States Patent
Wang et al.

(10) Patent No.: US 11,626,341 B2
(45) Date of Patent: Apr. 11, 2023

(54) PACKAGE STRUCTURE

(71) Applicant: Taiwan Semiconductor Manufacturing Company, Ltd., Hsinchu (TW)

(72) Inventors: Shih-Hui Wang, New Taipei (TW); Der-Chyang Yeh, Hsin-Chu (TW); Shih-Peng Tai, Hsinchu County (TW); Tsung-Shu Lin, Hsinchu (TW); Yi-Chung Huang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/702,817

(22) Filed: Mar. 24, 2022

(65) Prior Publication Data
US 2022/0216123 A1    Jul. 7, 2022

Related U.S. Application Data

(63) Continuation of application No. 16/805,869, filed on Mar. 2, 2020, now Pat. No. 11,289,398.

(60) Provisional application No. 62/906,739, filed on Sep. 27, 2019.

(51) Int. Cl.
| | |
|---|---|
| *H01L 23/367* | (2006.01) |
| *H01L 23/13* | (2006.01) |
| *H01L 23/00* | (2006.01) |
| *H01L 23/498* | (2006.01) |
| *H01L 25/065* | (2023.01) |

(52) U.S. Cl.
CPC ......... *H01L 23/3675* (2013.01); *H01L 23/13* (2013.01); *H01L 23/49816* (2013.01); *H01L 23/49827* (2013.01); *H01L 23/49838* (2013.01); *H01L 24/16* (2013.01); *H01L 24/27* (2013.01); *H01L 24/32* (2013.01); *H01L 24/73* (2013.01); *H01L 24/81* (2013.01); *H01L 24/83* (2013.01); *H01L 24/92* (2013.01); *H01L 25/0655* (2013.01); *H01L 2224/16227* (2013.01); *H01L 2224/32245* (2013.01); *H01L 2224/73253* (2013.01); *H01L 2224/92225* (2013.01)

(58) Field of Classification Search
CPC ...... H01L 23/3675; H01L 23/13; H01L 23/16
See application file for complete search history.

(56) References Cited

U.S. PATENT DOCUMENTS

| | | | |
|---|---|---|---|
| 2010/0084761 A1* | 4/2010 | Shinagawa | ......... H01L 25/0655 438/117 |
| 2019/0355697 A1* | 11/2019 | Lin | ......................... H01L 24/09 |

* cited by examiner

*Primary Examiner* — Errol V Fernandes
(74) *Attorney, Agent, or Firm* — JCIPRNET

(57) ABSTRACT

A package structure includes a substrate, a semiconductor device and an adhesive layer. The semiconductor device is disposed on the substrate, wherein an angle θ is formed between one sidewall of the semiconductor device and one of sides of the substrate, 0°<θ<90°. The adhesive layer surrounds the semiconductor device on the substrate and at least continuously disposed at two of the sides of the substrate, wherein the adhesive layer has a first opening misaligned with a corner of the semiconductor device closest to the first opening.

20 Claims, 15 Drawing Sheets

PACKAGE STRUCTURE

CROSS-REFERENCE TO RELATED APPLICATION

This application is a continuation application of and claims the priority benefit of a prior application Ser. No. 16/805,869, filed on Mar. 2, 2020 and now allowed, which claims the priority benefit of U.S. provisional application Ser. No. 62/906,739, filed on Sep. 27, 2019. The entirety of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. With high integration density, heat dissipation is a challenge in the semiconductor packages. In general, a heatsink may be attached onto the semiconductor package so as to improving the heat dissipation of the semiconductor package. However, there are many challenges related to attach the heatsink onto the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
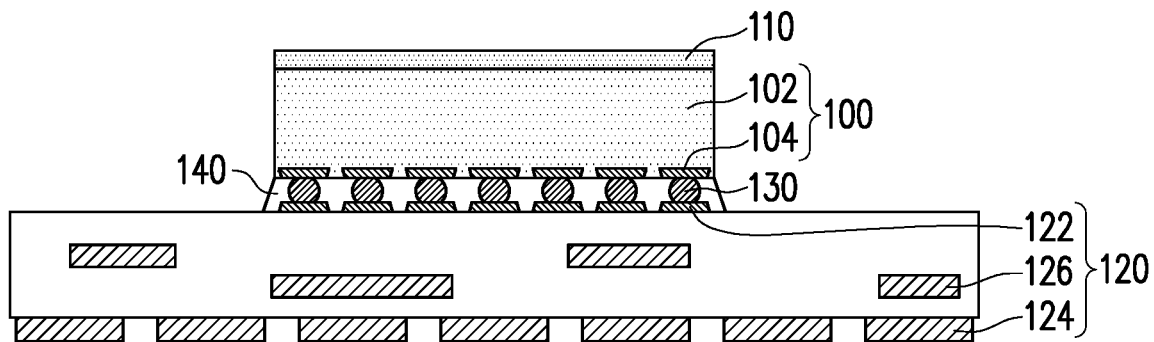
FIGS. 1A through 1D schematically illustrate cross-sectional views for manufacturing a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good first dies to increase the yield and decrease costs.

Figure 1B:
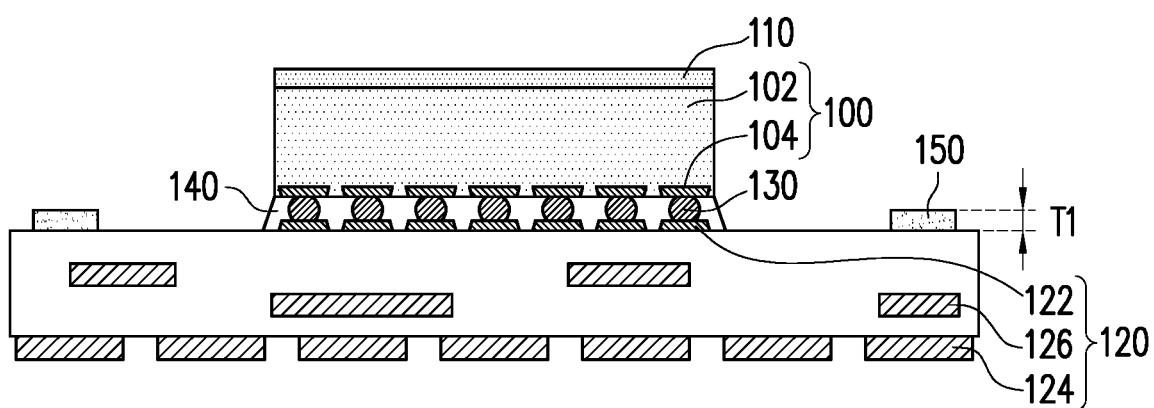
Figure 1C:
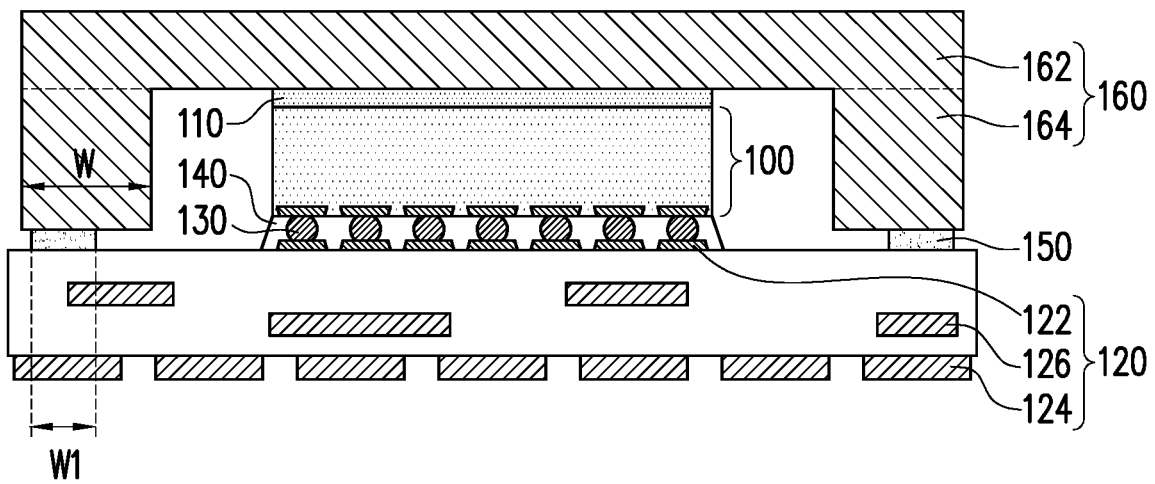

FIGS. 1A through 1D schematically illustrate cross-sectional views for manufacturing a package structure in accordance with some embodiments of the disclosure. FIGS. 2A through 2C are a schematic top view of a manufacturing method of the package structure in FIGS. 1A through 1C, wherein FIGS. 1A through 1C are schematic cross-sectional views along lines I-I' of FIGS. 2A through 2C, respectively.

Referring to FIGS. 1A and 2A, a semiconductor device 100 is provided. The semiconductor device 100 is a die or a semiconductor package (e.g. System on a Chip package). In some embodiments, the semiconductor device 100 is a die including an integrated circuit 102 and connecting pads 104 formed on an active surface of the integrated circuit 102. In certain embodiments, the connecting pads 104 may further include pillar structures for bonding the semiconductor device 100 to other structures.

A substrate 120 is provided. The substrate 120 includes connecting pads 122, connecting pads 124, metallization layers 126, and vias (not shown). In some embodiments, the connecting pads 122 and the connecting pads 124 are respectively distributed on two opposite sides of the substrate 120, and are exposed for electrically connecting with other elements/features. In some embodiments, the metallization layers 126 and the vias are embedded in the substrate 120 and together provide routing function for the substrate 120, and the metallization layers 126 and the vias are electrically connected to the connecting pads 122 and the connecting pads 124. In other words, at least some of the connecting pads 122 are electrically connected to some of the connecting pads 124 through the metallization layers 126 and the vias. In some embodiments, the materials of the connecting pads 122 and the connecting pads 124 may include metal. In some embodiments, the materials of the metallization layers 126 and the vias may be substantially the same or similar to the material of the connecting pads 122 and the connecting pads 124. In some embodiments, the substrate 120 may include an organic flexible substrate or a printed circuit board.

Then, the semiconductor device 100 is bonded onto a substrate 120. In some embodiments, a plurality of electrical connectors 130 are located between the semiconductor device 100 and the substrate 120 for bonding. In some embodiments, the semiconductor device 100 is attached onto the substrate 120, for example, through flip-chip bonding by way of the electrical connectors 130. Through the reflow process, the connecting pads 122 and connecting pads 104 are jointed to the electrical connectors 130, so as to electrically connect the semiconductor device 100 to the substrate 120. In some embodiments, the electrical connectors 130 are solder bumps, lead-free solder bumps, or micro bumps, such as controlled collapse chip connection (C4) bumps or micro bumps containing copper pillars. In some embodiments, the semiconductor device 100 is bonded onto the substrate 120 to form a stacked structure.

As shown in FIG. 2A, an angle θ is formed between one sidewall of the semiconductor device 100 and one sidewall of the substrate 120, wherein 0°<θ<90°. In some embodiments, the semiconductor device 100 is square shape or rectangular shape and includes a first sidewall 100a, a second sidewall 100b, a third sidewall 100c, and a fourth sidewall 100d. Similarly, the substrate 120 is square shape or rectangular shape and includes a first sidewall 120a, a second sidewall 120b, a third sidewall 120c, and a fourth sidewall 120d. Acute angles (e.g. θ ) are formed between the first sidewall 100a and each of the first to fourth sidewalls 120a-120d, between the second sidewall 100b and each of the first to fourth sidewalls 120a-120d, between the third sidewall 100c and each of the first to fourth sidewalls 120a-120d, and between the fourth sidewall 100d and each of the first to fourth sidewalls 120a-120d. In some embodiments, the angles θ are about 45 degrees.

A corner C1 is formed between the first and second sidewalls 100a and 100b, and the corner C1 is nearer to the first sidewall 120a of the substrate 120 than to the second to fourth sidewalls 120b-120d of the substrate 120. A shortest distance D1 between the corner C1 and the first sidewall 120a is smaller than a shortest distance between the first sidewall 100a and the first sidewall 120a and a shortest distance between the second sidewall 100b and the first sidewall 120a. In other words, the corner C1 is the nearest location of the semiconductor device 100 to the first sidewall 120a of the substrate 120, and the first sidewall 120a is also referred to as the respective sidewall of the corner C1.

A corner C2 is formed between the second and third sidewalls 100b and 100c, and the corner C2 is nearer to the second sidewall 120b of the substrate 120 than to the first, third, and fourth sidewalls 120a, 120c, 120d of the substrate 120. A shortest distance D2 between the corner C2 and the second sidewall 120b is smaller than a shortest distance between the second sidewall 100b and the second sidewall 120b and a shortest distance between the third sidewall 100c and the second sidewall 120b. In other words, the corner C2 is the nearest location of the semiconductor device 100 to the second sidewall 120b of the substrate 120, and the second sidewall 120b is also referred to as the respective sidewall of the corner C2.

A corner C3 is formed between the third and fourth sidewalls 100c and 100d, and the corner C3 is nearer to the third sidewall 120c of the substrate 120 than to the first, second, and fourth sidewalls 120a, 120b, 120d of the substrate 120. A shortest distance D3 between the corner C3 and the third sidewall 120c is smaller than a shortest distance between the third sidewall 100c and the third sidewall 120c and a shortest distance between the fourth sidewall 100d and the third sidewall 120c. In other words, the corner C3 is the nearest location of the semiconductor device 100 to the third sidewall 120c of the substrate 120, and the third sidewall 120c is also referred to as the respective sidewall of the corner C3.

A corner C4 is formed between the first and fourth sidewalls 100a and 100d, and the corner C4 is nearer to the fourth sidewall 120d of the substrate 120 than to the first to third sidewalls 120a-120c of the substrate 120. A shortest distance D4 between the corner C4 and the fourth sidewall 120d is smaller than a shortest distance between the first sidewall 100a and the fourth sidewall 120d and a shortest distance between the fourth sidewall 100d and the fourth sidewall 120d. In other words, the corner C4 is the nearest location of the semiconductor device 100 to the fourth sidewall 120d of the substrate 120, and the fourth sidewall 120d is also referred to as the respective sidewall of the corner C4. In some embodiments, the shortest distances D1-D4 are in a range of 2 mm to 12 mm.

As mentioned above, the shortest distances D1-D4 between the semiconductor device 100 and the substrate 120 are formed between the corners C1-C4 of the semiconductor device 100 and the respective sidewalls 120a-120d of the substrate 120. That is, the shortest distance between the first to fourth sidewalls 120a-120d of the substrate 120 and the corners C1-C4 of the semiconductor device 100 is smaller than a shortest distance between the first to fourth sidewalls 100a-100d of the semiconductor device 100 and the first to fourth sidewalls 120a-120d of the substrate 120.

Base on the arrangement of the semiconductor device 100, a routing region of a circuit on the substrate 120 may be evenly distributed. That is, the integration of the circuit disposed on the substrate 120 may be increased.

In some embodiments, the semiconductor device 100 and the substrate 120 are both square shape, and the corners C1-C4 of the semiconductor device 100 are respectively substantially aligned with middles of the first to fourth sidewalls 120a-120d of the substrate 120. However, the disclosure is not limited thereto. In other embodiments, one of the semiconductor device 100 and the substrate 120 is square shape and the other of the semiconductor device 100 and the substrate 120 is rectangular shape.

After bonding, an underfill structure 140 may be formed between the semiconductor device 100 and the substrate 120. The underfill structure 140 may cover the electrical connectors 130 and fill up the spaces between the semiconductor device 100 and the substrate 120, so as to protect the electrical connectors 130 between the connecting pads 104 and the connecting pads 122. In other embodiments, the underfill structure 140 further cover vertical sidewalls of the semiconductor device 100. In some alternative embodiments, the underfill structure 140 may be omitted. In other words, the semiconductor device 100 may be a bare die.

In some embodiments, a thermal interface material 110 is disposed on the semiconductor device 100 to cover the semiconductor device 100. The thermal interface material 110 may be electrically conductive materials or electrically insulative materials. The thermal interface material 110 includes a polymeric material (e.g., silicone and silica gel), a solder paste (e.g., indium solder paste), or other film type material (e.g., graphite and CNT). The method of forming the thermal interface material 110 includes, for example, printing, dispensing, film lamination, or the like. The thermal interface material 110 may be formed before or after bonding the semiconductor device 100 onto the substrate 120.

Referring to FIGS. 1B and 2B, an adhesive material layer 150 is formed on the substrate 120 to surround the semiconductor device 100. In some embodiments, the adhesive material layer 150 is formed on the substrate 120 after bonding the semiconductor device 100 onto the substrate 120. However, the disclosure is not limited thereto. In some alternative embodiments, the adhesive material layer 150 is formed on the substrate 120 before bonding the semiconductor device 100 onto the substrate 120. In some embodiments, the adhesive material layer 150 is formed for adhering of a heat spreader onto the substrate 120. The method of forming the adhesive material layer 150 includes, for example, printing, dispensing, film lamination, or the like.

In some embodiments, the materials of the adhesive material layer 150 includes thermosetting polymer, thermoplastic polymer, or epoxy, and the disclosure is not limited thereto. In some alternative embodiments, the adhesive material layer 150 may be any other suitable adhesive materials as long as the attachment of the heat spreader onto the substrate 120 may be achieved.

In some embodiments, the adhesive material layer 150 includes first to fourth adhesive parts 150a-150d arranged in sequence as shown in FIG. 2B. The extending directions of the first to fourth adhesive parts 150a-150d are respectively parallel with a corresponding adjacent sidewall of the substrate 120. In some embodiments, the extending directions of the first to fourth adhesive parts 150a-150d are respectively parallel with the first to fourth sidewalls 120a-120d of the substrate 120. A width W1 of each of the first to fourth adhesive parts 150a-150d is in a range of 1000 μm to 20000 μm. A thickness T1 of each of the first to fourth adhesive parts 150a-150d is in a range of 50 μm to 100 μm. In some embodiments, the width W1 of the first to fourth adhesive parts 150a-150d may be substantially the same, and the thickness T1 of the first to fourth adhesive parts 150a-150d may be substantially the same.

In some embodiments, the adhesive material layer 150 is a ring shape with a first opening O1. The first opening O1 is disposed in the first adhesive part 150a and adjacent to the first sidewall 120a of the substrate 120. A width W2 of the first opening O1 is in a range of 100 μm to 10000 μm. A distance D5 between the first opening O1 and the second adhesive part 150b is smaller than a distance D6 between the first opening O1 and the fourth adhesive part 150d, for example. In other words, the first opening O1 is not disposed at the middle of the first adhesive part 150a. A distance between the middle of the first opening O1 and the first corner C1 of the semiconductor device 100 is larger than a distance between the middle of the first opening O1 and the second sidewall 100b of the semiconductor device 100. That is, the first opening O1 is misaligned with the corner C1 of the semiconductor device 100 which is the closest location of the semiconductor device 100 to the first opening O1. Since the first opening O1 is misaligned with the corner C1, the stress concentration point of the adhesive material layer 150 corresponding to the corner C1 of semiconductor device 100 may be released. Therefore, the reliability failure of the adhesive layer may be prevented.

Referring to FIGS. 1C and 2C, a heat spreader 160 is disposed on the substrate 120 to cover the semiconductor device 100 and the thermal interface material 110. That is, the semiconductor device 100 and the thermal interface material 110 are disposed between the heat spreader 160 and the substrate 120. The heat spreader 160 is attached onto the substrate 120 through the adhesive material layer 150. In some embodiments, the heat spreader 160 is in direct contact with the thermal interface material 110 located between the semiconductor device 100 and the heat spreader 160, so as to enhance heat dissipation.

The heat spreader 160 may be a conductive lid as shown in FIG. 1C, a water cooling device, or a heatsink device. The heat spreader 160 may be formed from a material with high thermal conductivity, such as steel, stainless steel, copper, the like, or combinations thereof. In addition, the heat spreader 160 may be additionally coated with another metal such as gold. In some embodiments, the heat spreader 160 is integrally formed. However, in some alternative embodiments, the heat spreader 160 are formed by a plurality of separated pieces.

In some embodiments, the heat spreader 160 includes a main portion 162 and a supporting portion 164. The main portion 162 is substantially covering a top surface of the semiconductor device 100. In some embodiments, the main portion 162 is substantially parallel to the top surface of the semiconductor device 100. The supporting portion 164 is located between the main portion 162 and the adhesive material layer 150. The supporting portion 164 is substantially perpendicular to the main portion 162. In some embodiments, a bottom of the supporting portion 164 is in contact with the adhesive material layer 150. A width of the bottom of the supporting portion 164 is W, and a width W1 of the adhesive material layer 150 is ranging from 0.5 W to W, for example.

In some embodiments, the width W1 of the adhesive material layer 150 may be increased after being pressed since the adhesive material layer 150 may be pressed by the heat spreader 160 thereover. Therefore, in order to avoid the adhesive material layer 150 being squeezed out of the bottom surface of the supporting portion 164 after placing the heat spreader 160 thereover, the width W1 of the adhesive material layer 150 before being pressed is designed as being smaller than the width W of the supporting portion 164.

Figure 1D:
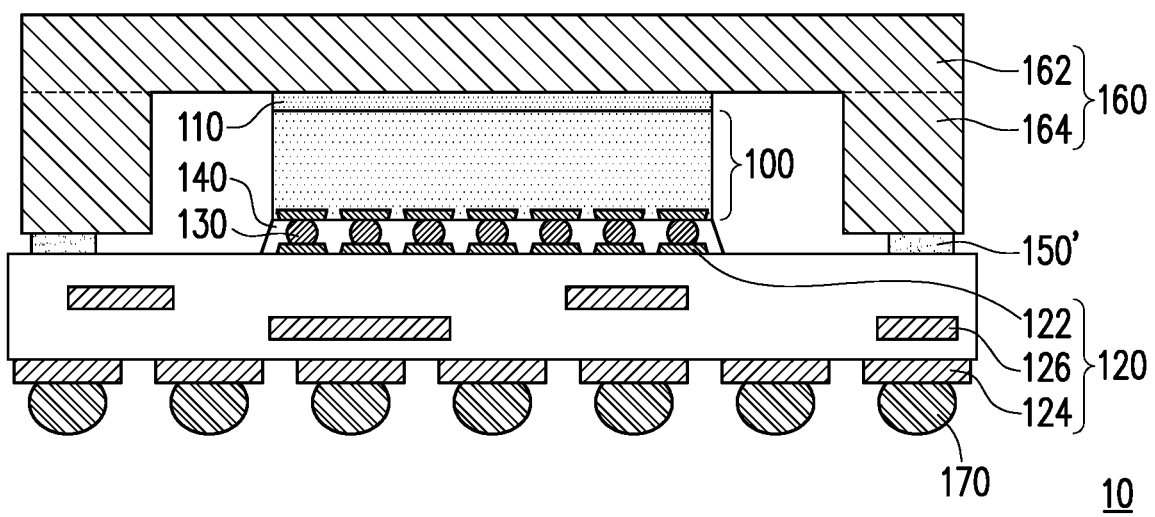
Figure 2A:
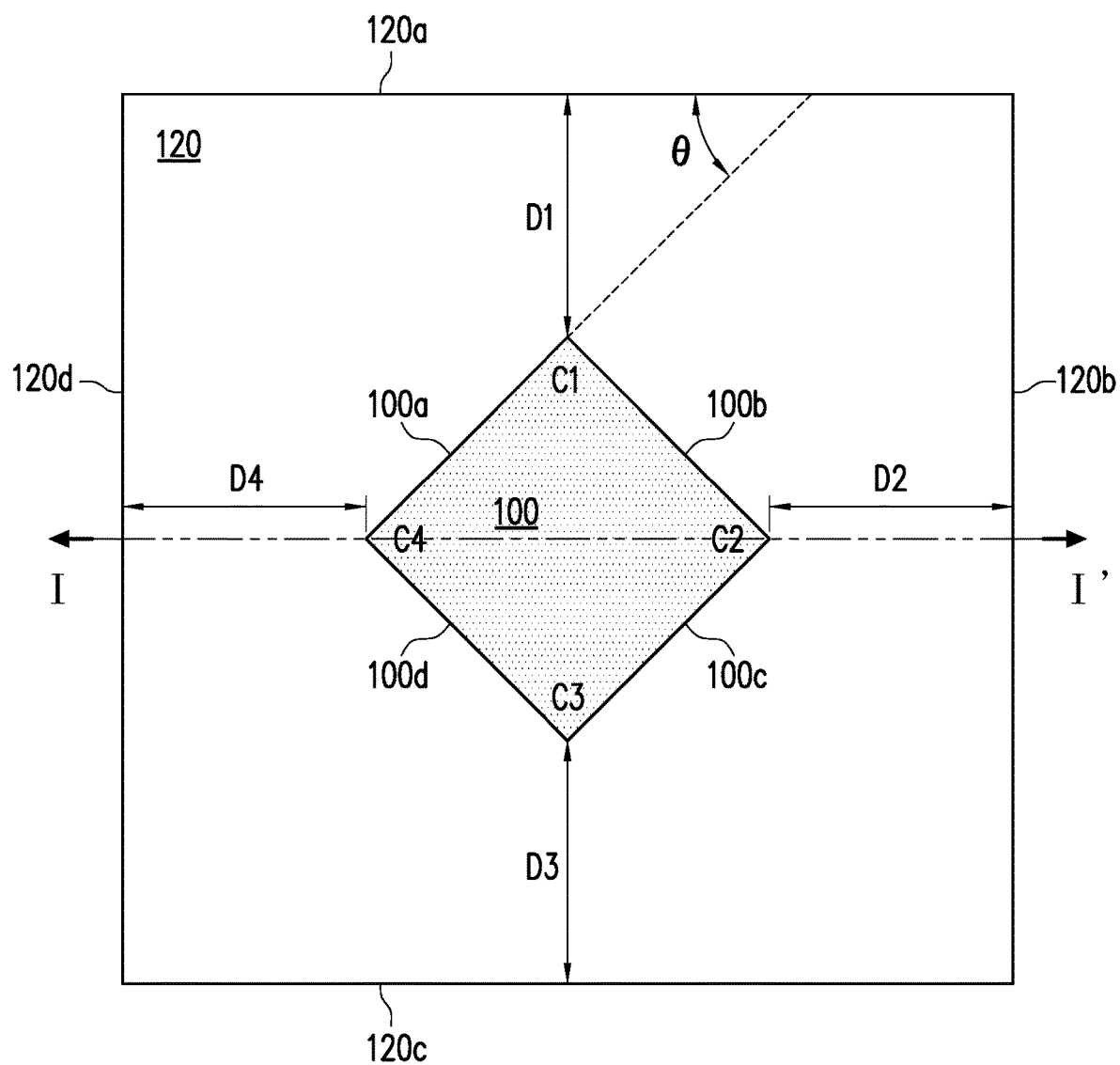
FIGS. 2A through 2C are a schematic top view of a manufacturing method of the package structure in FIGS. 1A through 1C, respectively.
Figure 2B:
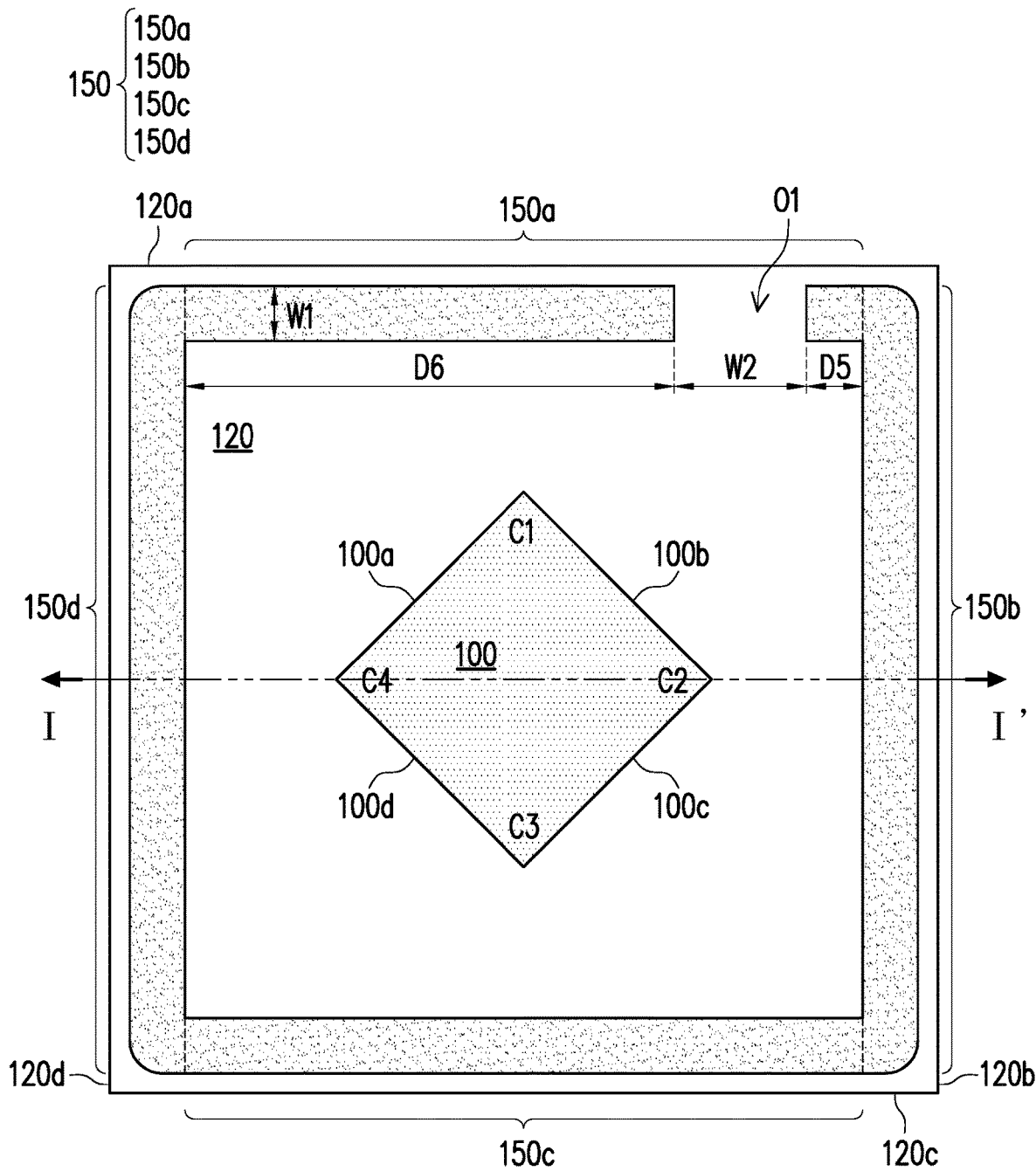
Figure 2C:
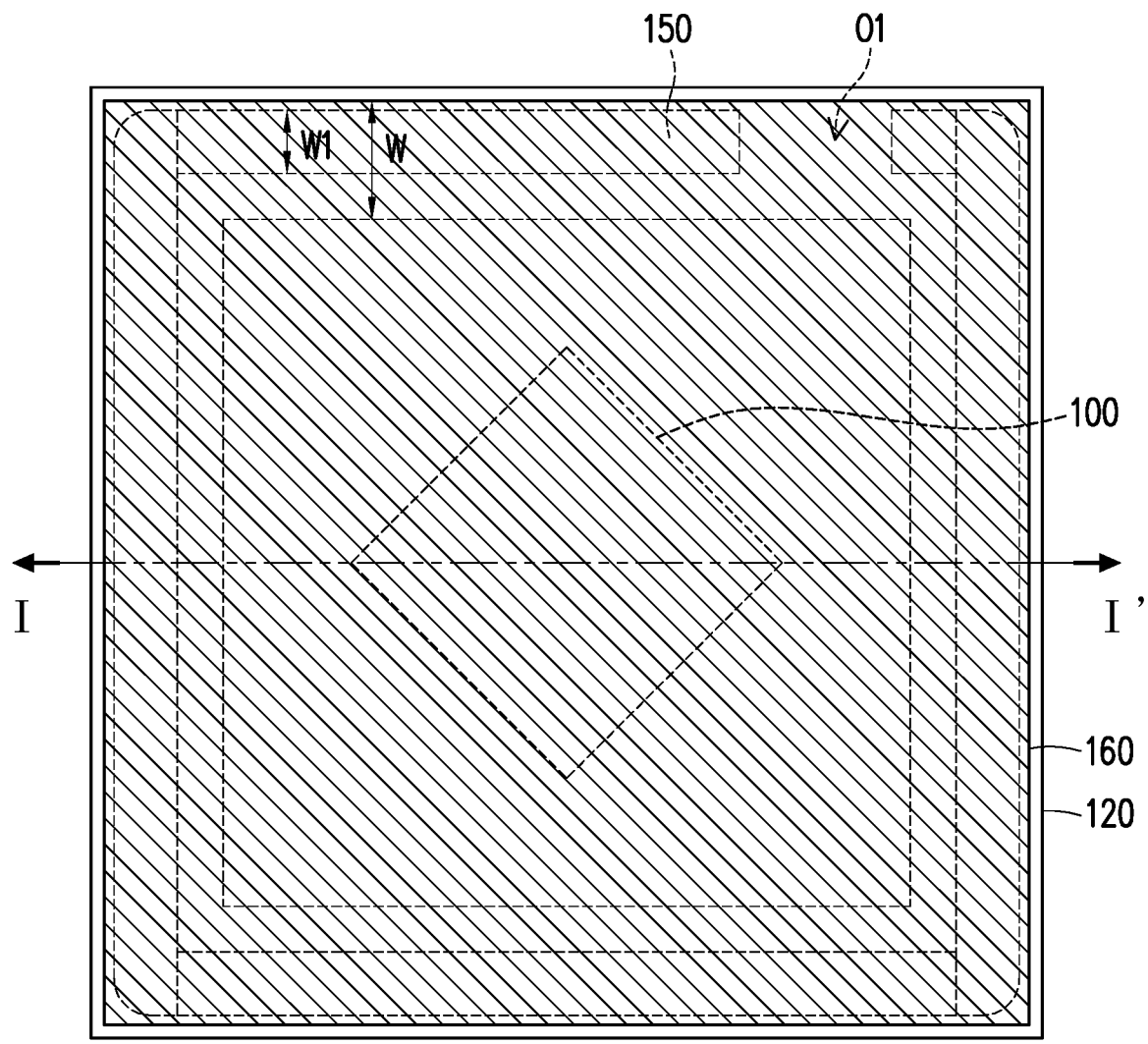

Referring to FIGS. 1D, the adhesive material layer 150 is cured to form an adhesive layer 150'. In some embodiments, the adhesive material layer 150 may be cured by a heating process, and the heating process may be performed at 100 degrees Celsius to 180 degrees Celsius. In some embodiments, the thermal interface material 110 may also be cured by the heating process. When the thermal interface material 110 is heated, a gas may be released from the thermal interface material 110. The gas may be water vapor or organic gas, for example. In this case, the first opening O1 may serve as an outlet for the gas, that is, the gas may pass through the first opening O1.

Then, a plurality of conductive terminals 170 are respectively formed on the substrate 120. As illustrated in FIG. 1D, the conductive terminals 170 are electrically connected to the connecting pads 124 of the circuit substrate 120, for example. In other words, the conductive terminals 170 are electrically connected to the substrate 120 through the connecting pads 124. Through the connecting pads 122 and the connecting pads 124, some of the conductive terminals 170 are electrically connected to the semiconductor device 100. In some embodiments, the conductive terminals 170 are, for example, solder balls.

Base on above, a package structure 10 includes the adhesive layer 150' with the first opening O1. The first opening O1 is misaligned with the corner C1 of semiconductor device 100, such that the stress concentration point of the adhesive layer 150' corresponding to the corner C1 of semiconductor device 100 may be released. Therefore, the reliability failure of the adhesive layer 150 may be prevented.

Figure 3A:
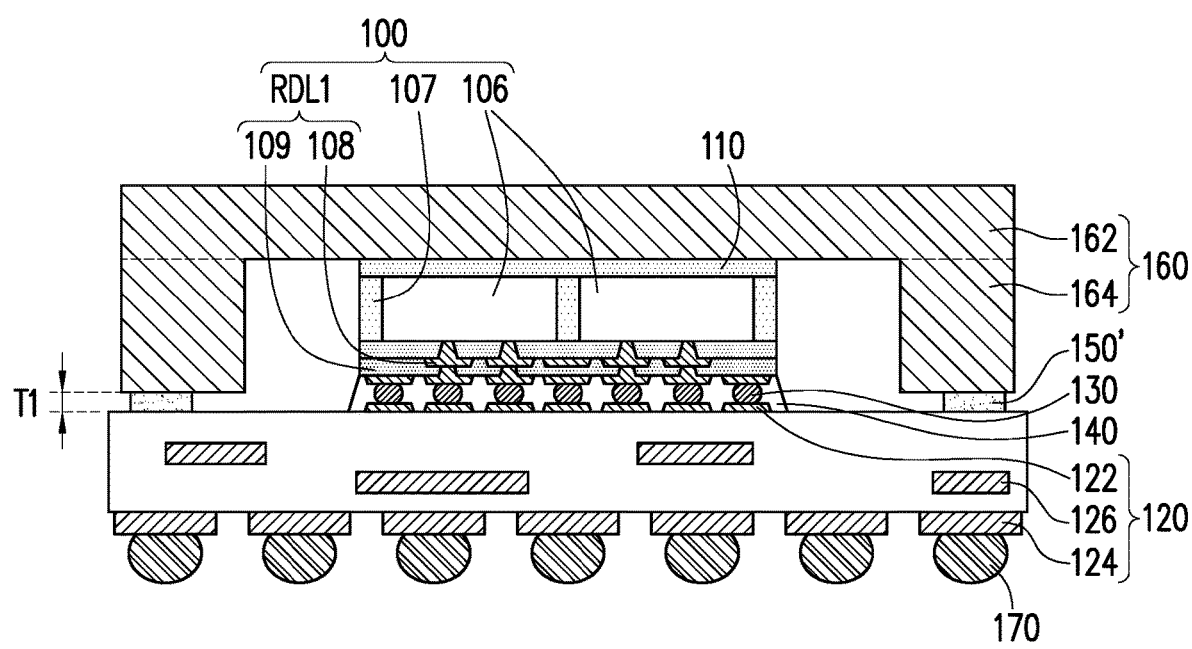
FIG. 3A schematically illustrates a cross-sectional view of a package structure in accordance with some embodiments of the disclosure.
Figure 3B:
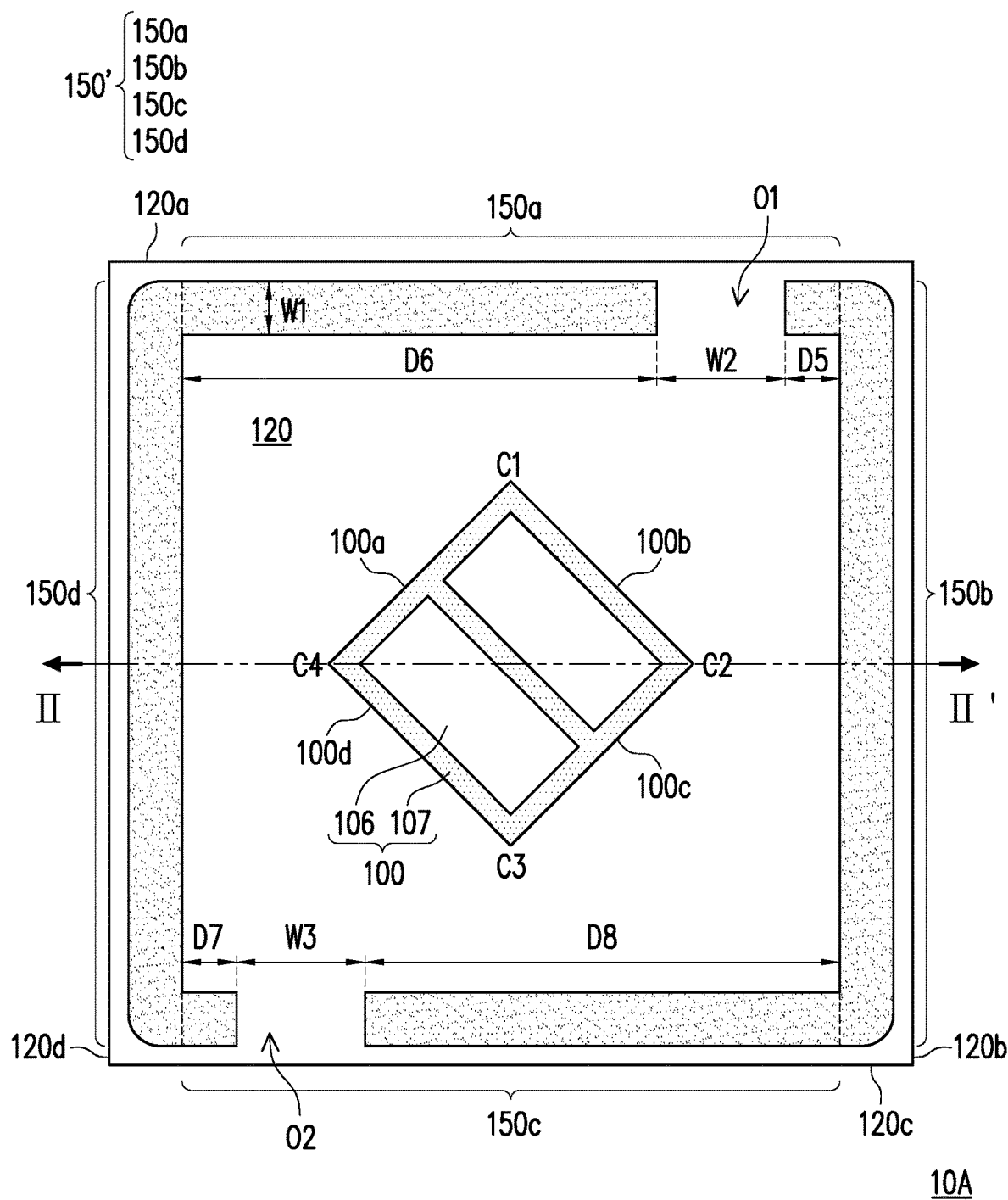
FIG. 3B is a schematic top view of the package structure in FIG. 3A.

FIG. 3A schematically illustrates a cross-sectional view of a package structure in accordance with some embodiments of the disclosure. FIG. 3B is a schematic top view of the package structure in FIG. 3A, wherein FIG. 3A is a schematic cross-sectional view along lines II-II' of FIG. 3B. It should be noted that the heat spreader 160 in FIG. 3B is omitted.

A package structure 10A of FIG. 3A is similar to the package structure 10 of FIG. 1D, hence the same reference numerals are used to refer to the same and liked parts, and its detailed description will be omitted herein. The main difference lies in that the semiconductor device 100 of the package structure 10A includes a plurality of dies 106, a redistribution layer structure RDL1, and an insulating encapsulant 107.

Referring to FIGS. 3A and 3B, the dies 106 are encapsulated by the insulating encapsulant 107. The die 106 may include a logic die (e.g. a central processing unit (CPU) die, a graphics processing unit (GPU) die, a system-on-a-chip (SoC) die, a microcontroller or the like), a power management die (e.g. a power management integrated circuit (PMIC) die or the like), a memory die (e.g. a dynamic random access memory (DRAM) die, a static random access memory (SRAM) die, a high bandwidth memory (HBM) Bier the like), or combinations thereof. However, the disclosure is not limited thereto, and the number, sizes and types of the dies 106 may be appropriately adjusted based on product requirement. In some embodiments, a material of the encapsulant 107 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the encapsulant 107 may include an acceptable insulating encapsulation material. In some embodiments, the encapsulant 107 may further include inorganic filler or inorganic compound (e.g. silica, clay, and so on) which can be added therein to optimize coefficient of thermal expansion (CTE) of the encapsulant 107. However, the disclosure is not limited thereto.

The redistribution layer structure RDL1 is formed on the encapsulant 107 and the dies 106, and the redistribution layer structure RDL1 is electrically connected with the dies 106. That is, the semiconductor device 100 may be an integrated fan-out package. The redistribution layer structure RDL1 includes a plurality of conductive patterns 108 and a plurality of dielectric layers 109 stacked alternately. In some embodiments, the formation of the redistribution layer structure RDL1 may include sequentially forming a plurality of conductive patterns 108 and a plurality of dielectric layers 109. In some embodiments, the conductive patterns 108 may be conductive lines and/or vias. In some embodiments, the outermost conductive pattern 108 is used as bonding pads, and the outermost conductive pattern 108 is located at a side of the redistribution layer structure RDL1 facing to the substrate 120.

In some embodiments, the redistribution layer structure RDL1 is attached onto the substrate 120 by the electrical connectors 130. Through the reflow process, the connecting pads 122 and the outermost conductive pattern 108 are jointed to the electrical connectors 130, so as to electrically connect the semiconductor device 100 and the substrate 120.

In some embodiments, the adhesive layer 150' includes first to fourth adhesive parts 150a-150d arranged in sequence. The extending directions of the first to fourth adhesive parts 150a-150d are respectively parallel with a corresponding adjacent sidewall of the substrate 120. In some embodiments, the extending directions of the first to fourth adhesive parts 150a-150d are respectively parallel with the first to fourth sidewalls 120a-120d of the substrate 120. A width W1 of each of the first to fourth adhesive parts 150a-150d is in a range of 2000 μm to 10000 μm. A thickness T1 of each of the first to fourth adhesive parts 150a-150d is in a range of 50 μm to 100 μm.

In some embodiments, the adhesive layer 150 is a ring shape with a first opening O1 and a second opening O2. The first opening O1 is disposed in the first adhesive part 150a and adjacent to the first sidewall 120a of the substrate 120. The second opening O2 is disposed in the third adhesive part 150c and adjacent to the third sidewall 120c of the substrate 120. A width W2 of the first opening O1 and a width W3 of the second opening is in a range of 100 μm to 10000 μm. A distance D5 between the first opening O1 and the second adhesive part 150b is smaller than a distance D6 between the first opening O1 and the fourth adhesive part 150d. A distance between the middle of the first opening O1 and the first corner C1 of the semiconductor device 100 is larger than a distance between the middle of the first opening O1 and the second sidewall 100b of the semiconductor device 100. That is, the first opening O1 is misaligned with the corner C1 of the semiconductor device 100 which is the closest location of the semiconductor device 100 to the first opening O1. A distance D8 between the second opening O2 and the second adhesive part 150b is greater than a distance D7 between the second opening O2 and the fourth adhesive part 150d. A distance between the middle of the second opening O2 and the third corner C3 of the semiconductor device 100 is larger than a distance between the middle of the second opening O2 and the fourth sidewall 100d of the semiconductor device 100. That is, the second opening O2 is misaligned with the corner C3 of the semiconductor device 100 which is the closest location of the semiconductor device 100 to the second opening O2.

Since the first opening O1 is misaligned with the corner C1 and the second opening O2 is misaligned with the corner C3, the stress concentration point of the adhesive layer corresponding to the corners C1, C3 of semiconductor device 100 may be released. Therefore, the reliability failure of the adhesive layer may be prevented.

Figure 4A:
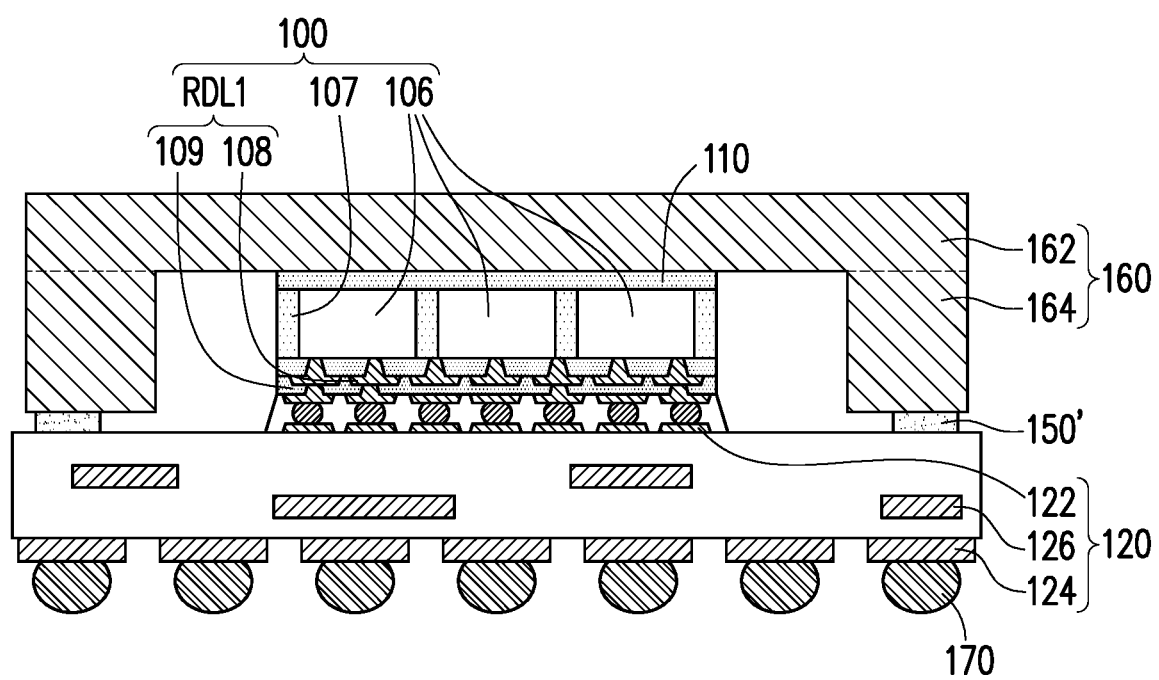
FIG. 4A schematically illustrates a cross-sectional view of a package structure in accordance with some embodiments of the disclosure.
Figure 4B:
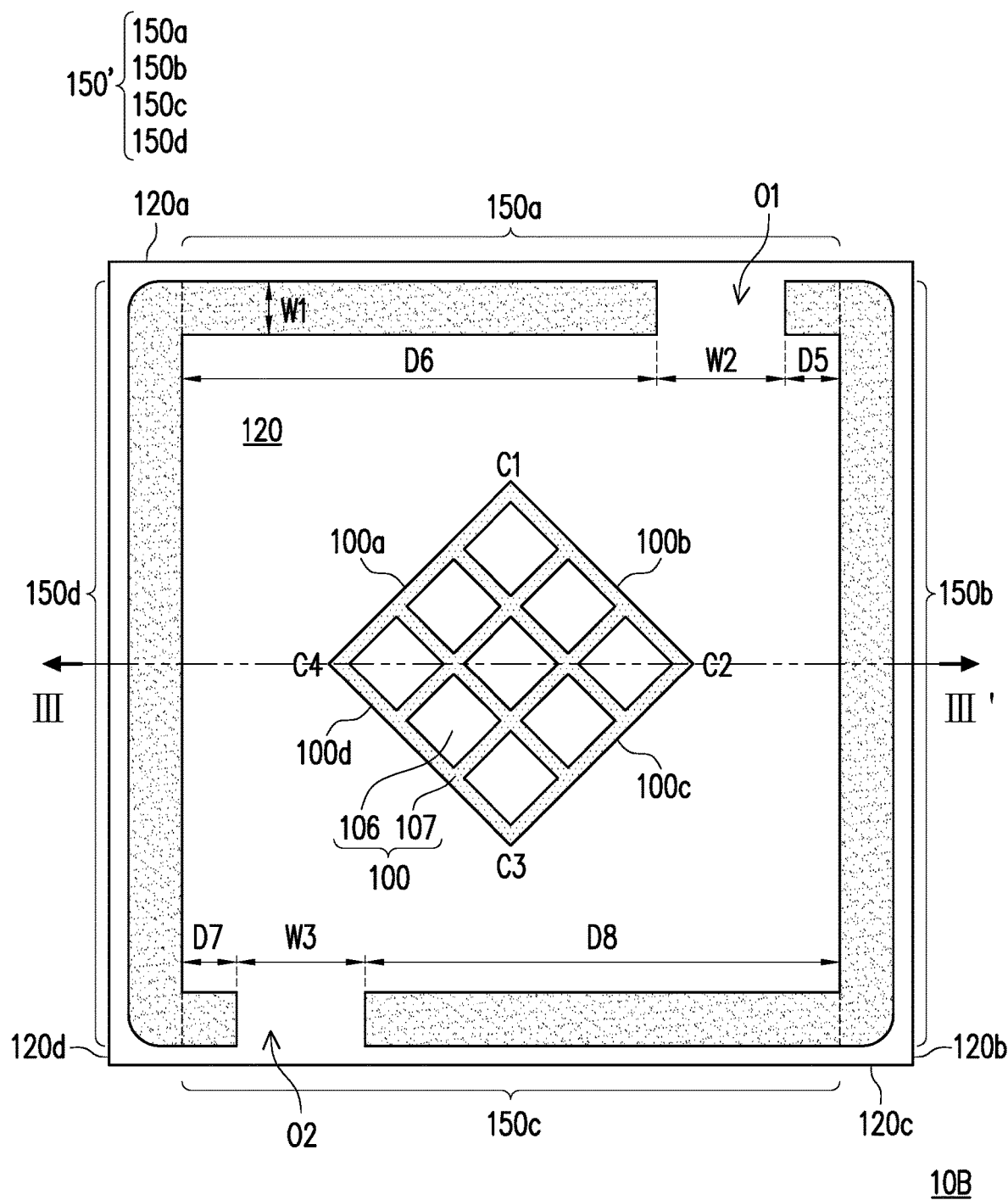
FIG. 4B is a schematic top view of the package structure in FIG. 4A.

FIG. 4A schematically illustrates a cross-sectional view of a package structure in accordance with some embodiments of the disclosure. FIG. 4B is a schematic top view of the package structure in FIG. 4A, wherein FIG. 4A is a schematic cross-sectional view along lines III-III' of FIG. 4B. It should be noted that the heat spreader 160 in FIG. 4B is omitted.

The package structure 10B of FIG. 4A is similar to the package structure 10A of FIG. 3A, hence the same reference numerals are used to refer to the same and liked parts, and its detailed description will be omitted herein. The main difference lies in that the semiconductor device 100 of the package structure 10B includes more than two dies 106 (for example, nine dies 106).

Figure 5A:
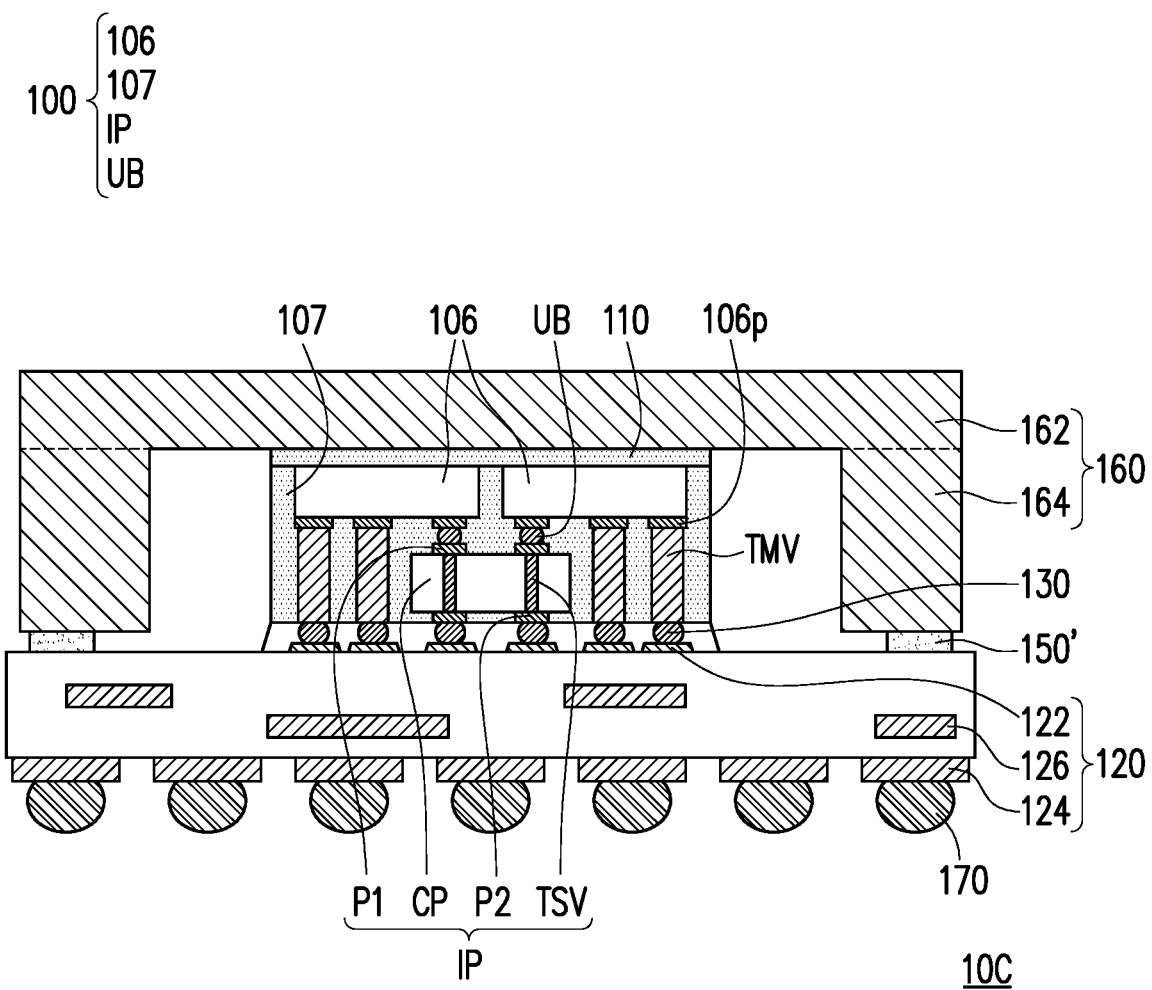
FIG. 5A schematically illustrates a cross-sectional view of a package structure in accordance with some embodiments of the disclosure.
Figure 5B:
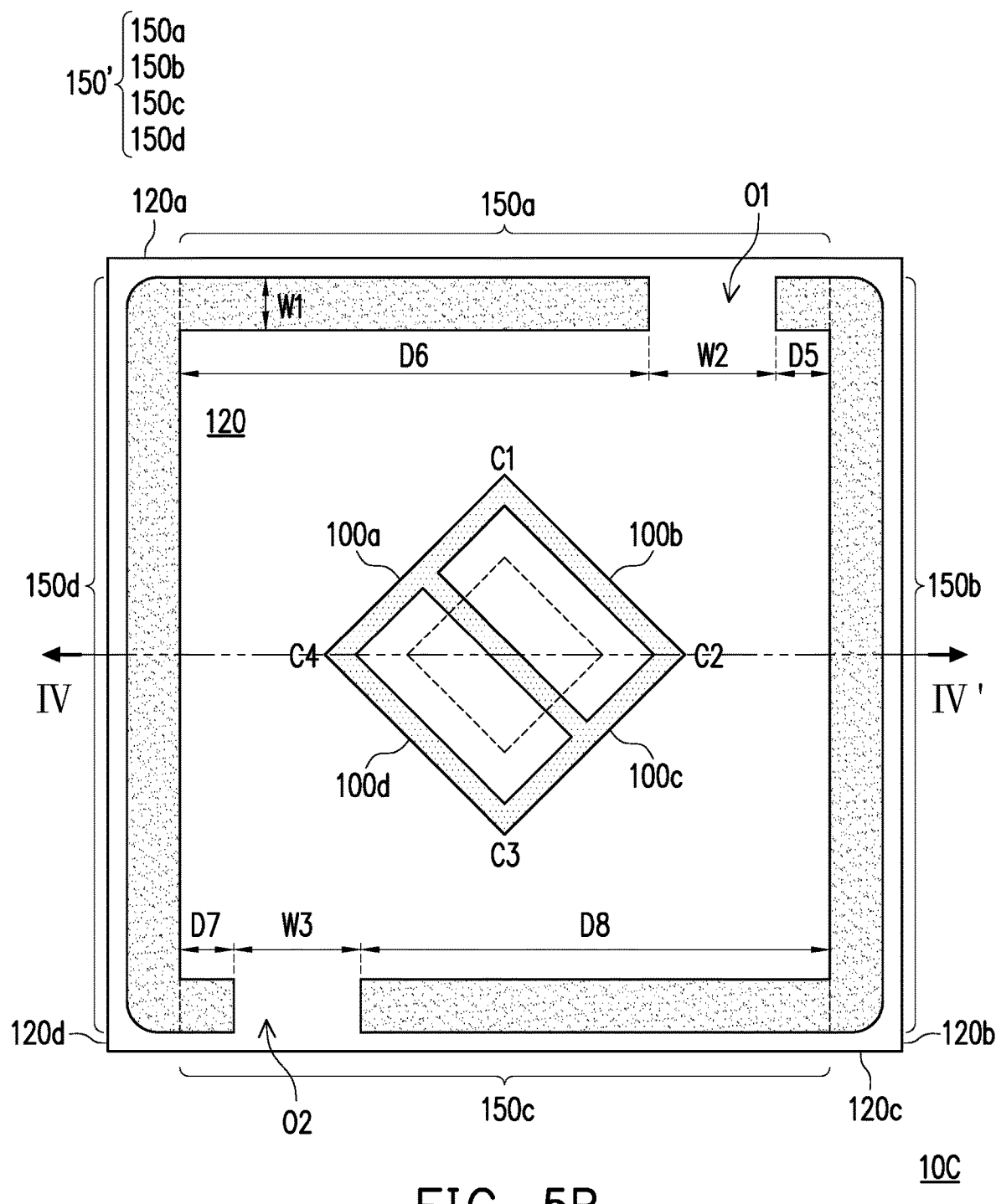
FIG. 5B is a schematic top view of the package structure in FIG. 5A.

FIG. 5A schematically illustrates a cross-sectional view of a package structure in accordance with some embodiments of the disclosure. FIG. 5B is a schematic top view of the package structure in FIG. 5A, wherein FIG. 5A is a schematic cross-sectional view along lines IV-IV' of FIG. 5B. It should be noted that the heat spreader 160 in FIG. 5B is omitted.

The package structure 10C of FIG. 5A is similar to the package structure 10A of FIG. 3A, hence the same reference numerals are used to refer to the same and liked parts, and its detailed description will be omitted herein. The main difference lies in that the semiconductor device 100 of the package structure 10C is a large-scale integration (LSI) package including a plurality of dies 106, electrical connectors UB, a redistribution layer structure RDL1, an insulating encapsulant 107, and an interposer structure IP.

Referring to FIGS. 5A and 5B, the interposer structure IP includes a core portion CP, a plurality of vias TSV, a plurality of pads P1, and a plurality of pads P2. In some embodiments, the core portion CP may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias TSV is through silicon vias penetrating the core portions CP.

The pads P1, and the pads P2 are formed on the opposite sides of the core portion CP, respectively. The vias TSV are plated or filled with conductive material so as to electrically connect the pads P1 and the pads P2.

The dies 106 are electrically connected with the pads P1 through the electrical connectors UB. Through the reflow process, the pads P1 and the connecting pads 106p of the dies 106 are jointed to the electrical connectors UB, so as to electrically connecting the dies 106 to the interposer structure IP. In one embodiment, the electrical connectors UB are micro-bumps, such as micro-bumps having copper metal pillars. The pads P2 are electrically connected with the connecting pads 122 of the substrate 120.

The dies 106 and the interposer structure IP are covered by the insulating encapsulant 107. Through mold vias TMV are formed through the encapsulant 107 on the dies 106. The through mold vias TMV are plated or filled with conductive materials so as to electrically connect the dies 106 to the connecting pads 122 of the substrate 120.

Figure 6A:
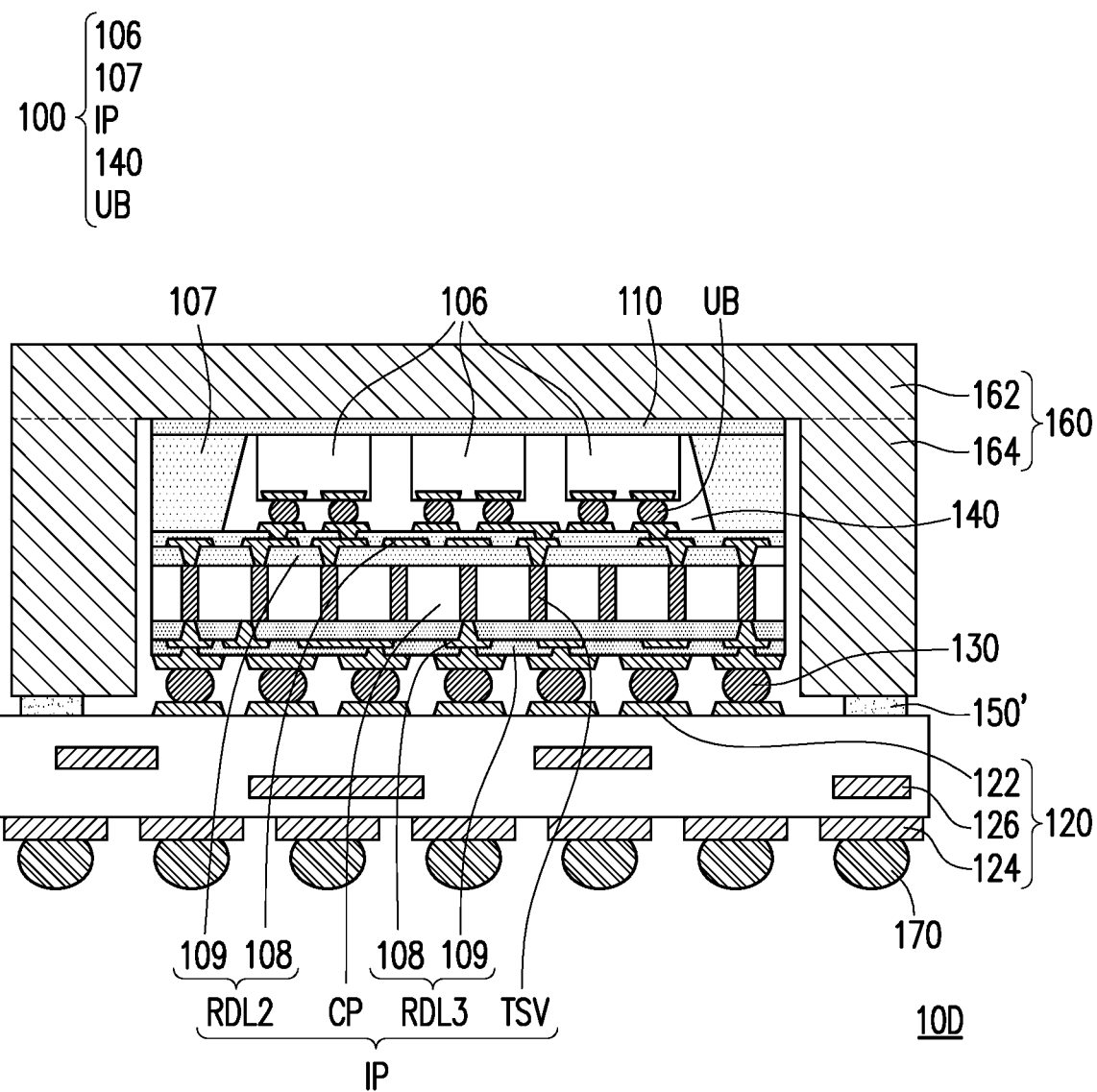
FIG. 6A schematically illustrates a cross-sectional view of a package structure in accordance with some embodiments of the disclosure.
Figure 6B:
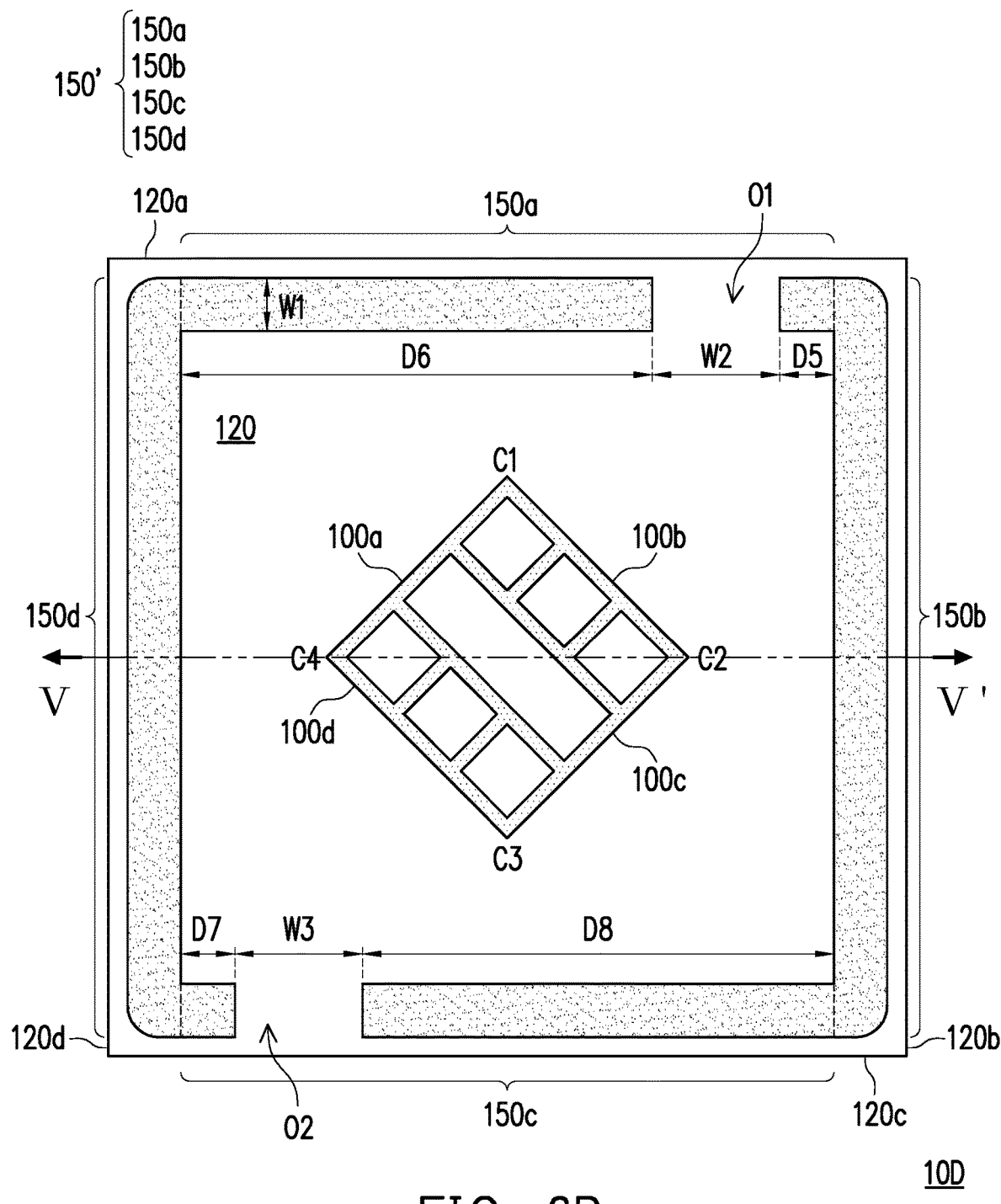
FIG. 6B is a schematic top view of the package structure in FIG. 6A.

FIG. 6A schematically illustrates a cross-sectional view of a package structure in accordance with some embodiments of the disclosure. FIG. 6B is a schematic top view of the package structure in FIG. 6A, wherein FIG. 6A is a schematic cross-sectional view along lines V-V' of FIG. 6B. It should be noted that the heat spreader 160 in FIG. 5B is omitted.

The package structure 10D of FIG. 6A is similar to the package structure 10C of FIG. 5A, hence the same reference numerals are used to refer to the same and liked parts, and its detailed description will be omitted herein. The main difference lies in that the package structure 10D is a chip on wafer on substrate (CoWoS) package.

Referring to FIGS. 6A and 6B, the semiconductor device 100 includes a plurality of dies 106, electrical connectors UB, an underfill structure 140, an insulating encapsulant 107, and an interposer structure IP.

The interposer structure IP includes a core portion CP, a plurality of vias TSV, a redistribution layer structure RDL2, and a redistribution layer structure RDL3. Each of the redistribution layer structure RDL2 and the redistribution layer structure RDL3 includes a plurality of conductive patterns 108 and a plurality of dielectric layers 109 stacked alternately. The dies 106 are bonded onto the redistribution layer structure RDL2 of the interposer structure IP through the electrical connectors UB. A space between the electrical connectors UB is filled with underfill structure 140. In some embodiments, more than two of the dies 106 with different size are bonded onto the interposer structure IP. However, the disclosure is not limited thereto, and the number, sizes and types of the dies 106 may be appropriately adjusted based on product requirement.

The insulating encapsulant 107 covers the dies 106, the underfill structure 140, and the redistribution layer structure RDL2.

The redistribution layer structure RDL3 is attached onto the substrate 120 through the electrical connectors 130. In one embodiment, the electrical connectors 130 are solder bumps, lead-free solder bumps, or micro bumps, such as controlled collapse chip connection (C4) bumps or micro bumps containing copper pillars.

Figure 7A:
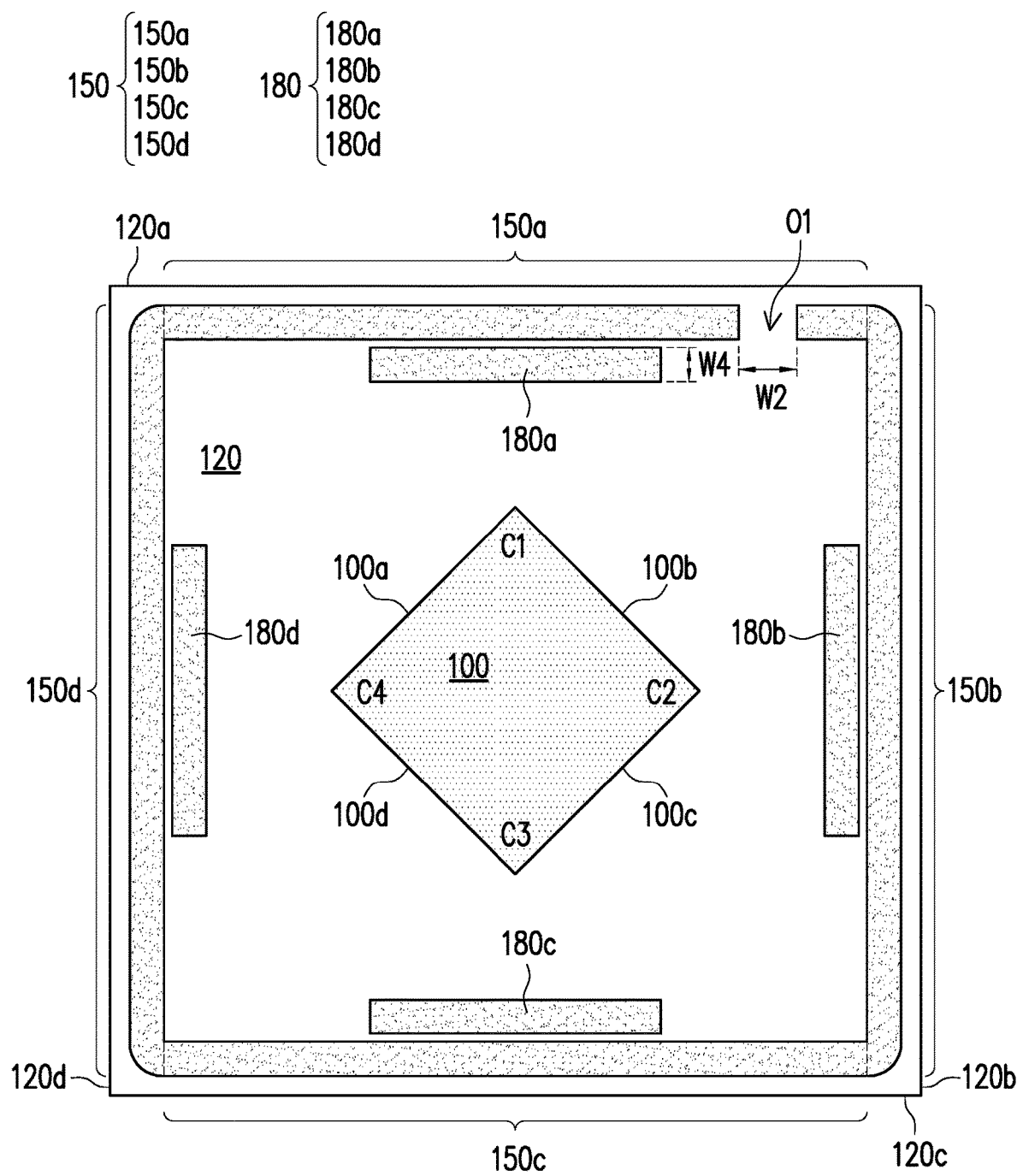
FIGS. 7A and 7B schematically illustrate top views for manufacturing a package structure in accordance with some embodiments of the disclosure.
Figure 7B:
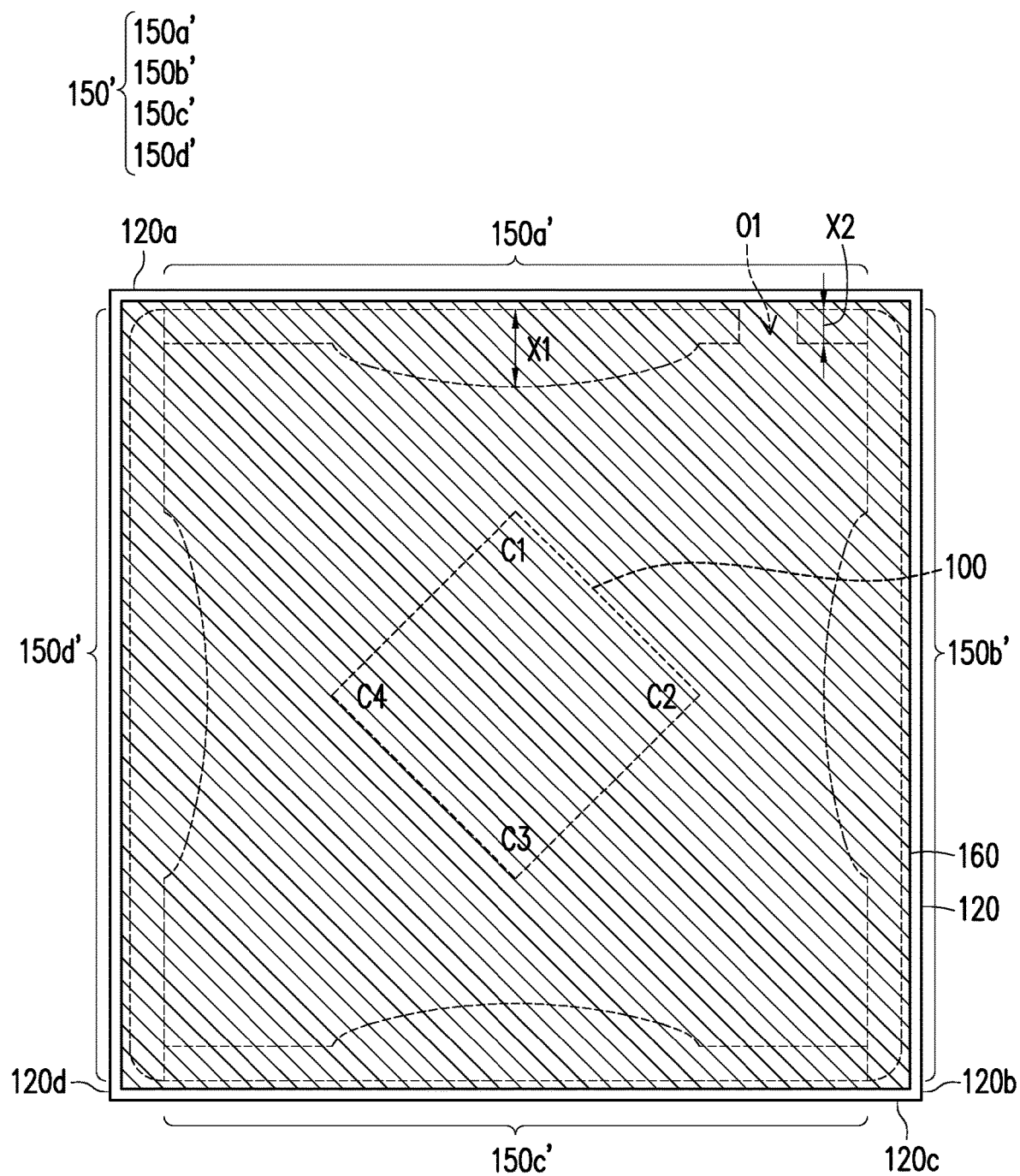

FIGS. 7A and 7B schematically illustrate top views for manufacturing a package structure in accordance with some embodiments of the disclosure.

The package structure 10E of FIG. 7B is similar to the package structure 10 of FIG. 2C, hence the same reference numerals are used to refer to the same and liked parts, and its detailed description will be omitted herein. The main difference lies in that the manufacturing method of the package structure 10E further includes forming an adhesive material layer 180.

Referring to FIG. 7A, the adhesive material layer 150 is formed on the substrate 120 and surrounding the semiconductor device 100. The adhesive material layer 180 is formed on the substrate 120 and surrounding the semiconductor device 100. In some embodiments, the adhesive material layer 180 includes first to fourth parts 180a-180d. The first to fourth parts 180a-180d are separated from each other and adjacent to the corners C1-C4 of the semiconductor device 100, respectively. In some embodiments, the adhesive material layer 180 is located between the semiconductor device 100 and the adhesive material layer 150. That is, the first part 180a is located between the corner C1 and the middle of the first adhesive part 150a, the second part 180b is located between the corner C2 and the middle of the second adhesive part 150b, the third part 180c is located between the corner C3 and the middle of the third adhesive part 150c, and the fourth part 180d is located between the corner C4 and the middle of the fourth adhesive part 150d. However, the disclosure is not limited thereto. In other embodiments, the adhesive material layer 150 is located between the semiconductor device 100 and the adhesive material layer 180.

The method of forming the adhesive material layers 150, 180 includes, for example, printing, dispensing, film lamination, or the like. A width W4 of each of the first to fourth adhesive parts 180a-180d is in a range of 100 μm to 2000 μm. A thickness of each of the first to fourth adhesive parts 180a-180d is in a range of 50 μm to 100 μm.

In some embodiments, the adhesive material layer 150 is a ring shape with a first opening O1. The first opening O1 is disposed in the first adhesive part 150a and adjacent to the first sidewall 120a of the substrate 120. A width W2 of the first opening O1 is in a range of 100 μm to 10000 μm.

Referring to FIG. 7B, a heat spreader 160 is disposed on the substrate 120 to cover the semiconductor device 100 and the thermal interface material 110. The heat spreader 160 is attached onto the substrate 120 through the adhesive material layers 150, 180.

After disposing the heat spreader 160, the adhesive material layer 150 and the adhesive material layer 180 are connected together to form an adhesive material layer 150' including first to fourth adhesive parts 150a'-150d'. In some embodiments, a heating process is performed on the adhesive material layer 150 so as to cure the adhesive material layer 150.

In some embodiments, the first adhesive part 150a' is formed from the first part 150a of the adhesive material layer 150 and the first part 180a of the adhesive material layer 180. That is, a width X1 of the middle of the first adhesive part 150a' corresponding to the first part 180a is greater than a width X2 of the adhesive layer 150' adjacent to the corners of the substrate 120. In some embodiments, the width X1 of the adhesive layer 150' adjacent to the corner C1 of the semiconductor device 100 is larger than a width X2 of the adhesive layer adjacent to the first opening O1. Similarly, the second adhesive part 150b' is formed from the second part 150b of the adhesive material layer 150 and the second part 180b of the adhesive material layer 180, the third adhesive part 150c' is formed from the third part 150c of the adhesive material layer 150 and the third part 180c of the adhesive material layer 180, the fourth adhesive part 150d' is formed from the fourth part 150d of the adhesive material layer 150 and the fourth part 180d of the adhesive material layer 180. Widths of the middle of the second to fourth adhesive part 150b'-150d' (respectively adjacent to the corners C2-C4 of the semiconductor device 100) are greater than a width X2 of the adhesive layer 150' adjacent to the corners of the substrate 120.

Base on above, the adhesive layer 150' adjacent to the corners of the semiconductor device 100 has the width greater than the width of the adhesive layer 150' adjacent to the corners of the substrate 120. Therefore, the stress concentration point of the adhesive layer 150' corresponding to the corners of semiconductor device 100 may be dispersed and the reliability failure of the adhesive layer may be prevented.

In some embodiments of the present disclosure, a package structure includes a substrate, a semiconductor device, a heat spreader, and an adhesive layer. The semiconductor device is bonded onto the substrate, wherein an angle θ is formed between one sidewall of the semiconductor device and one sidewall of the substrate, 0°<θ<90°. The heat spreader is disposed over the substrate, wherein the semiconductor device is disposed between the heat spreader and the substrate. The adhesive layer is surrounding the semiconductor device and attaching the heat spreader onto the substrate, wherein the adhesive layer has a first opening misaligned with one of corners of the semiconductor device closest to the first opening.

In some embodiments of the present disclosure, a package structure includes a substrate, a semiconductor device, an adhesive, and a conductive lid. The semiconductor device is bonded onto the substrate. The semiconductor device includes a first sidewall, a second sidewall and a corner formed between the first and second sidewalls, the corner is nearer to a sidewall of the substrate than to other sidewalls of the substrate. A shortest distance between the corner of the semiconductor device and the sidewall of the substrate is smaller than a shortest distance between each of the first sidewall and the second sidewall of the semiconductor device and the sidewall of the substrate. The adhesive layer is surrounding the semiconductor device. The adhesive layer has a first opening, and the first opening is adjacent to the sidewall of the substrate and misaligned with the corner of the semiconductor device. The conductive lid is attaching to the substrate by the adhesive layer.

In some embodiments of the present disclosure, a manufacturing method of a package structure includes following steps. A semiconductor device is provided. The semiconductor device is bonded onto a substrate, wherein a shortest distance between sidewalls of the substrate and corners of the semiconductor device is smaller than a shortest distance between sidewalls of the semiconductor device and sidewalls of the substrate. A thermal interface material is formed to cover the semiconductor device. An adhesive material layer surrounding the semiconductor device is formed, wherein the adhesive material layer has a first opening misaligned with one of corners of the semiconductor device closest to the first opening. A heat spreader is disposed to cover the semiconductor device and the thermal interface material. The adhesive material layer is cured to form an adhesive layer.

In some embodiments of the present disclosure, a package structure includes a substrate, a semiconductor device and an adhesive layer. The semiconductor device is disposed on the substrate, wherein an angle θ is formed between one sidewall of the semiconductor device and one of sides of the substrate, 0°<θ<90°. The adhesive layer surrounds the semiconductor device on the substrate and at least continuously disposed at two of the sides of the substrate, wherein the adhesive layer has a first opening misaligned with a corner of the semiconductor device closest to the first opening.

In some embodiments of the present disclosure, a package structure includes a semiconductor device and an adhesive layer. The semiconductor device is disposed on a substrate, wherein the semiconductor device has a first diagonal and a second diagonal. The adhesive layer surrounds the semiconductor device and is at least continuously disposed at two sides of the substrate, wherein the adhesive layer has a first opening misaligned with the first diagonal and the second diagonal of the semiconductor device.

In some embodiments of the present disclosure, a package structure includes a semiconductor device and an adhesive layer. The semiconductor device is disposed on a substrate, wherein an angle θ is formed between one sidewall of the semiconductor device and a side of the substrate, 0°<θ<90°. The adhesive layer surrounds the semiconductor device on the substrate, wherein a portion of the adhesive layer at the side of the substrate is nearest to a corner of the semiconductor device, and a width of the portion of the adhesive layer is greater than a width of other portions of the adhesive layer at the side of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
 a substrate;

a semiconductor device on the substrate, wherein an angle θ is formed between one sidewall of the semiconductor device and one of sides of the substrate, 0°<74<90°; and an adhesive layer, surrounding the semiconductor device on the substrate and at least continuously disposed at two of the sides of the substrate, wherein the adhesive layer has a first opening misaligned with a corner of the semiconductor device closest to the first opening.

2. The package structure as claimed in claim 1, wherein the angle θ is about 45 degrees.

3. The package structure as claimed in claim 1, wherein the adhesive layer is continuously disposed at first to fourth sides of the substrate, and the first opening of the adhesive layer is disposed at one of the first to fourth sides of the substrate.

4. The package structure as claimed in claim 1, wherein the adhesive layer has a first adhesive portion continuously disposed at first and second sides of the substrate and a second adhesive portion continuously disposed at third and fourth sides of the substrate, and the first opening of the adhesive layer is disposed between the first adhesive portion and the second adhesive portion.

5. The package structure as claimed in claim 4, wherein the adhesive layer further comprises a second opening between the first adhesive portion and the second adhesive portion.

6. The package structure as claimed in claim 1, wherein the adhesive layer has a first adhesive portion continuously disposed at a first side, a second side and a third side of the substrate and a second adhesive portion continuously disposed at the first side, the third side and a fourth side opposite to the second side of the substrate, and the first opening of the adhesive layer is disposed between the first adhesive portion and the second adhesive portion.

7. A package structure, comprising:
a semiconductor device on a substrate, wherein the semiconductor device has a first diagonal and a second diagonal; and
an adhesive layer surrounding the semiconductor device and at least continuously disposed at two sides of the substrate, wherein the adhesive layer has a first opening misaligned with the first diagonal and the second diagonal of the semiconductor device.

8. The package structure as claimed in claim 7, wherein the first diagonal and the second diagonal of the semiconductor device are substantially overlapped with middle lines of the substrate.

9. The package structure as claimed in claim 7, wherein the substrate has first to fourth sides, and the first opening is disposed at a corner formed by adjacent two of the first to fourth sides of the substrate.

10. The package structure as claimed in claim 7, wherein the substrate has first to fourth sides, and the first opening is disposed at one of the first to fourth sides of the substrate.

11. The package structure as claimed in claim 7 further comprising a heat spreader bonded to the substrate through the adhesive layer.

12. The package structure as claimed in claim 7, wherein the semiconductor device comprises a plurality of dies, and the first opening is misaligned with each diagonal of the dies.

13. A package structure, comprising:
a semiconductor device on a substrate, wherein an angle θ is formed between one sidewall of the semiconductor device and a side of the substrate, 0°<θ<90°; and
an adhesive layer surrounding the semiconductor device on the substrate, wherein a portion of the adhesive layer at the side of the substrate is nearest to a corner of the semiconductor device, and a width of the portion of the adhesive layer is greater than a width of other portions of the adhesive layer at the side of the substrate.

14. The package structure as claimed in claim 13, wherein the adhesive layer has a first opening misaligned with the corner of the semiconductor device.

15. The package structure as claimed in claim 13, wherein a width of the adhesive layer decreases as a distance between the adhesive layer and the corner of the semiconductor device becomes larger.

16. The package structure as claimed in claim 13, wherein the portion of the adhesive layer comprises a first portion of a main adhesive part and an additional adhesive part between the first portion of the main adhesive part and the semiconductor device, and the other portions of the adhesive layer comprise a second portion physically connected to the first portion of the main adhesive part.

17. The package structure as claimed in claim 16, wherein the main adhesive part has a constant width.

18. The package structure as claimed in claim 16, wherein the additional adhesive part has a constant width.

19. The package structure as claimed in claim 16, wherein the additional adhesive part is separated from the main adhesive part.

20. The package structure as claimed in claim 16, wherein the additional adhesive part is physically connected to the main adhesive part.

* * * * *